United States Patent [19]

Farley et al.

[11] 4,343,088
[45] Aug. 10, 1982

[54] PRECISION TRIMMING DEVICE

[75] Inventors: Dewey R. Farley, Richmond; Vernon K. Holden, Sandston, both of Va.

[73] Assignee: Western Electric Co., Inc., New York, N.Y.

[21] Appl. No.: 164,655

[22] Filed: Jun. 30, 1980

[51] Int. Cl.³ .................. B26B 25/00; B24B 17/00; B26D 5/08
[52] U.S. Cl. .................. 30/273; 51/241 S; 83/565; 83/745; 409/184
[58] Field of Search .................. 30/124, 264; 83/678, 83/745, 574, 565; 409/184, 121; 51/100 R, 34 A, 241 S

[56] References Cited
U.S. PATENT DOCUMENTS

| | | | |
|---|---|---|---|
| 2,392,819 | 1/1946 | Gruenberg et al. | |
| 2,924,316 | 2/1960 | Berninghaus | |
| 3,209,632 | 10/1965 | Reising | 409/183 |
| 3,527,138 | 9/1970 | Boltz | 409/184 |
| 3,751,856 | 8/1973 | Jorgensen | 51/100 R |

*Primary Examiner*—Jimmy C. Peters
*Attorney, Agent, or Firm*—J. B. Hoofnagle

[57] ABSTRACT

A precision trimming device (18), which is provided for removing metal areas (12a) between contact pads (12) of a printed circuit board (10), includes a rotary drive motor (20) mounted for lateral and pivotal movement on a frame (22). The drive motor (20) supports a circular saw blade (24) which normally rests in a non-trimming position adjacent to the surface of the board (10). The saw blade (24) pivots into metal removing engagement with the board (10) by the action of a cam follower (50) on a camming bar (34). The frame (22) includes locator brackets (80, 82, 84 and 92) having pins (88) which are extendable into apertures (14) of the board (10) to facilitate locating the saw blade (24) for subsequent metal trimming.

11 Claims, 6 Drawing Figures

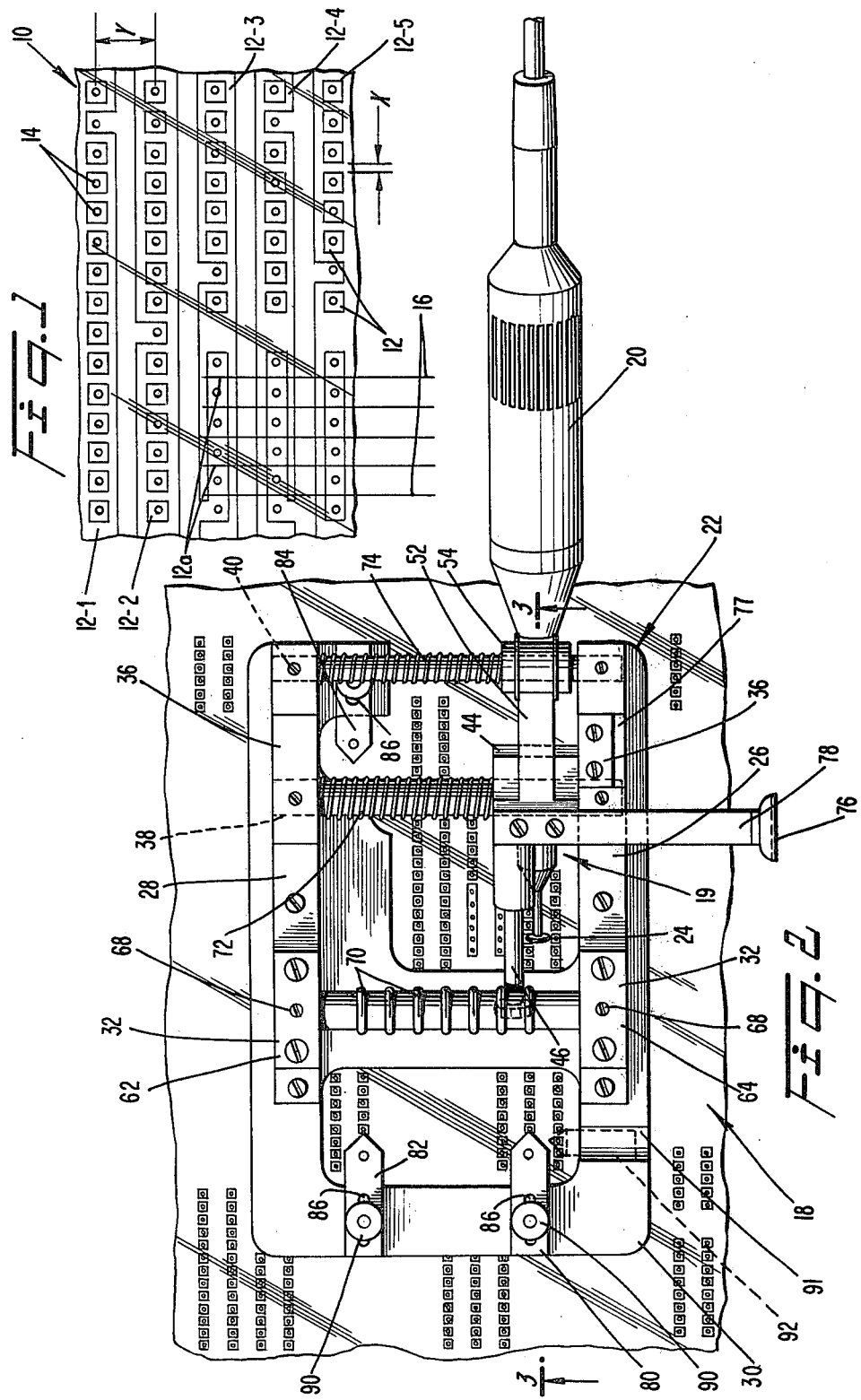

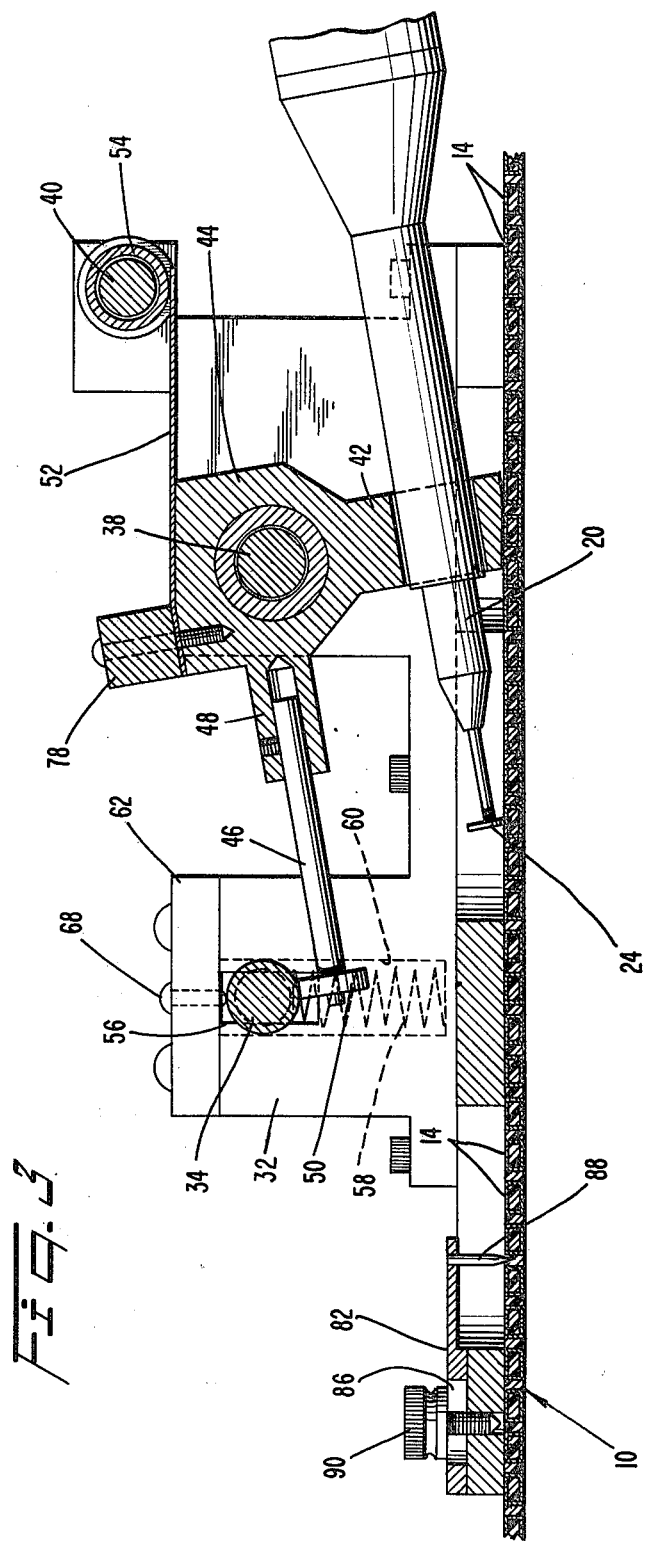

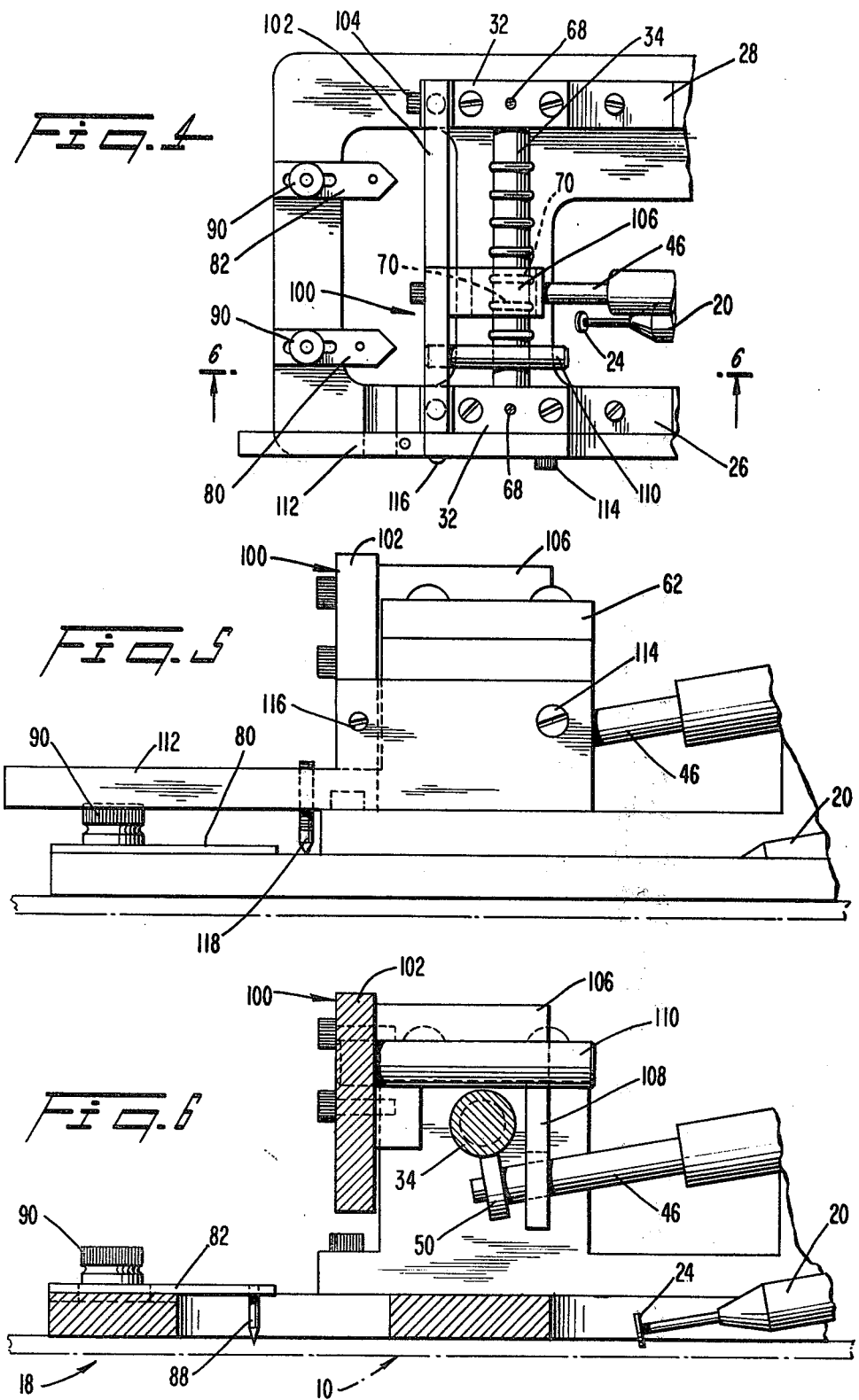

PRECISION TRIMMING DEVICE

TECHNICAL FIELD

This invention relates to a precision trimming device, and more particularly to a precision trimming device for selectively trimming a surface of an article, such as a printed circuit board, to a controlled depth.

BACKGROUND OF THE INVENTION

In the manufacture of certain printed circuit boards, a plurality of rows of closely spaced apertures in a substrate and regions of the substrate surrounding the apertures are plated by an appropriate masking-and-plating operation to form rows of small, closely spaced contact pads on either side of the board. Occasionally, however, the adjacent contact pads are too closely spaced or are actually formed together, which causes arcing or shorting between adjacent pads during use of the circuit board.

In the past, to cure this defect on the printed circuit boards, an operator would trim away the metal between the adjacent contact pads with a hand-held saw or other hand tool in an attempt to electrically isolate the pads from each other. However, this procedure was undesirable and did not produce consistent results because of the difficulty the operator experienced in accurately aligning the cutting tool between the small contact pads. Additionally, when trimming a multilayer board, the operator had to be extremely careful not to cut too deeply into the board to avoid damaging the circuit layers beneath the surface of the board. In this connection, improper aligning of the cutting tool with the contact pads and/or cutting too deeply into the board could result in the necessity for additional repair of the board or in scrapping of the board. The necessity for accurately aligning the cutting tool with the contact pads and for controlling the depth of cut also resulted in a tedious and time consuming operation.

In one material removing technique, U.S. Pat. No. 2,392,819 discloses an apparatus for grinding gear teeth on a gear wherein the teeth are to be nonrectilinear in an axial plane. The apparatus includes a grinding wheel for cutting the teeth of the gear and which is mounted on an oscillatory frame. The gear to be ground is mounted on a reciprocating table which also includes a cam member mounted thereon. A rod depends from the frame and includes a cam follower at one end thereof which moves along the surface of the cam as the table reciprocates to raise and lower the frame and the grinding wheel carried thereby, thus grinding the gear along a curved pattern which corresponds to the shape of the cam.

SUMMARY OF THE INVENTION

This invention is directed to a precision trimming device which is particularly adapted for precisely trimming selected surface areas of an article, such as a printed circuit board. The precision trimming device includes a frame which is positionable on a surface of the article and which includes trimming means mounted on the frame for trimming the surface of the article. The trimming means is mounted for movement in a first direction adjacent to the surface of the article to be trimmed and for simultaneous movement in a second direction perpendicular to the first direction. The precision trimming device further includes means mounted on the frame for precisely locating the frame relative to the article such that the trimming means is aligned with a preselected portion of the article. A first means is provided for moving the trimming means in the first direction and a second means, responsive to the movement of the trimming means in the first direction, is provided for moving the trimming means in the second direction.

BRIEF DESCRIPTION OF THE DRAWINGS

FIG. 1 is a plan view showing a portion of a printed circuit board;

FIG. 2 is a plan view showing a precision trimming device in accordance with certain principles of the invention positioned onto the printed circuit board of FIG. 1;

FIG. 3 is a sectional view taken along the line 3—3 of FIG. 2 showing the precision trimming device;

FIG. 4 is a plan view of the precision trimming device showing an attachment for facilitating spot and section trimming;

FIG. 5 is an elevational view of the precision trimming device showing selected details of the attachment of FIG. 4; and FIG. 6 is a sectional view taken along lines 6—6 of FIG. 4 showing details of the attachment.

DETAILED DESCRIPTION

As illustrated in FIG. 1, a portion of a printed circuit board 10, which may be a single layer or multilayer board, includes a plurality of rows 12-1 through 12-5 of small, closely spaced contact pads 12 plated on opposite sides of the board (only one side shown). The contact pads 12 surround respective through-plated apertures 14 in the board 10.

The centerlines of the rows 12-1 through 12-5 of the contact pads 12 and the apertures 14 normally are spaced apart a distance "Y" (e.g., 100 mils), and the contact pads are normally spaced from each other by a distance "X" (e.g., 25 mils), which spacing is sufficient to electrically isolate the individual contact pads from each other. However, occasionally, adjacent ones of the contact pads 12 are too closely spaced or are actually formed together as illustrated by metal areas 12a of contact pad rows 12-3, 12-4 and 12-5. Hence, the board 10 must be repaired by trimming away the metal areas 12a between the adjacent pads 12 along lines 16. Such trimming should preferably be to a depth only slightly greater than the thickness of the metal plating so as to avoid cutting too deeply into the substrate of the board 10. Thus, it is desirable to trim accurately between the adjacent pads 12 of the rows 12-3, 12-4 and 12-5 to a controlled depth in a rapid and consistent manner without otherwise disturbing the surface of the board 10.

Referring to FIG. 2, to accomplish the foregoing, a precision trimming device, designated generally by the numeral 18, in accordance with certain principles of this invention includes a cutter assembly designated generally by the numeral 19. The cutter assembly 19 includes a high speed rotary drive motor 20 which is mounted for horizontal and pivotal movement on a frame 22 and which supports a circular saw blade 24 for cutting between the contact pads 12. Referring to FIGS. 2 and 3, the frame 22, which is positionable on the surface of the printed circuit board 10, includes a pair of side plates 26 and 28 extending from a base 30. Each of the side plates 26 and 28 are provided with a front section 32 for supporting a camming bar 34 and a rear section 36 for supporting first and second parallel support shafts 38 and 40, respectively.

Referring to FIGS. 2 and 3, the motor 20 is removably secured on a first leg 42 of an operating lever 44 which is mounted for slidable and pivotal movement on the first support shaft 38. The pivotal movement of the operating lever 44 is limited in one direction by a rod 46 which extends from a second leg 48 of the operating lever generally parallel to the motor 20 and which carries a cam follower 50 at an outer free end. The cam follower 50 is normally biased against the camming bar 34 by a leaf spring 52 (FIG. 3) attached at one end to a top portion of the operating lever 44 and at an opposite end to a collar 54 slidably mounted on the second support shaft 40. In this manner, the saw blade 24 is normally urged away from the surface of the printed wiring board 10, when the frame 22 is positioned on the board.

The camming bar 34 is mounted in notches 56 (one shown) formed in the respective side plates 26 and 28 and is normally urged upwardly, as illustrated in FIG. 3, by a spring 58 seated in a cavity 60 of each side plate. To retain the camming bar 34 within the notch 56, cap members 62 and 64 are secured to the front sections 32 of the side plates 26 and 28, respectively. The cap members 62 and 64 each include an adjustment screw 68 which permits raising or lowering of the camming bar 34.

The camming bar 34 also includes a plurality of cam lobes 70 spaced apart from one another by a distance which corresponds to the centerline spacing Y (FIG. 1) of the adjacent rows 12-1 through 12-5 of the contact pads 12. The cam lobes 70 of the camming bar 36 protrude from the surface of the bar a distance slightly greater (e.g., 10 mils) than the thickness (e.g., 4 mils) of the metal plating of the contact pads 12. In this manner, when the cam follower 50 engages the cam lobes 70 the saw blade 24 pivots and trims into the metal areas 12a and the board 10 to a depth slightly greater than the thickness of the metal plating of the contact pads 12. By use of the adjustment screws 68, the camming bar 34 can be raised or lowered as noted above. This permits adjustment of the vertical range of travel of the saw blade 34 relative to the frame 22 during a trimming operation.

The operating lever 44 for the motor 20 is normally biased into a starting position toward the side plate 26, as is best shown in FIG. 2, by a coil spring 72. The spring 72 extends between the side plate 28 and the operating lever 44 in encircling relationship to the first support shaft 38. In this manner, the cam follower 50 of the operating lever 44 is normally positioned out of engagement with the cam lobes 70 of the camming bar 34 onto a smooth portion of the camming bar. Similarly, a second coil spring 74 is mounted between the second side wall 28 and the collar of the second support shaft 40 to bias the collar towards the first side plate 26.

A push button 76 and operating rod 78 is attached to the top portion of the operating lever 44. The button 76 and rod 78 facilitate the moving of the operating lever 44 and the collar 54 along the first and second support shafts 38 and 40, respectively, against the action of the coil springs 72 and 74, respectively. As the operating lever 44 and the collar 54 are moved along the axis of the first and second support shafts 38 and 40, respectively, the cam follower 50 rides along the surface of the camming bar 34. Thus, the cam follower 50 successively engages the cam lobes 70 of the camming bar 34 and causes successive slight pivotal movements of the motor 20 and the rotating saw blade 24 to move the saw blade into metal removing engagement with the metal areas 12a. A finger grip 77 is mounted on the side wall 26 to facilitate moving the operating lever 44 along the axis of the first support shaft 38.

The base plate 30 includes a pair of front location brackets 80 and 82 and a rear location bracket 84 (FIG. 2), which are mounted for slidable movement within guide grooves 86 formed into the base plate. The brackets 80, 82 and 84 are provided to facilitate accurate positioning of the saw blade 24 of the motor 20 along the cut lines 16 (FIG. 1) between the respective contact pads 12 of the printed circuit board 10. The front locating brackets 80 and 82 and the rear location bracket 84 include locating pins 88 (FIGS. 3 and 6) which are positionable into respective ones of the plated apertures 14 of the printed circuit board 10 for locating purposes. The front location brackets 80 and 82 and the rear locating bracket 84 are secured in guide grooves 86 by screws 90.

When the pins 88 of any two of the locating brackets 80, 82 and 84 are inserted into respective ones of the plated apertures 14 in the printed circuit board 10, the motor 20 can be positioned by sliding the base 30 relative to the locating brackets until the saw blade 24 is aligned with an associated one of the cut lines 16. In this manner, the saw blade 24 is positioned to trim the metal areas 12a between the adjacent contact pads 12 on opposite sides of the cut line 16. The front location brackets 80 and 82 are spaced from each other on centerlines which correspond to a multiple of the centerline-to-centerline distance "Y" of the adjacent rows of contact pads 12-1 through 12-5 such that the pins 88 of the front location brackets are aligned with respective apertures 14 of the board 10 when the device 18 is positioned on the board.

The precision trimming device 18 can also be utilized to trim the printed circuit boards 10 which do not contain defects, but which for some reason, require minor circuit alterations. For example, it may be desirable to change the circuit functions of a particular circuit board 10 by spot trimming or electrically isolating a selected area of the existing circuit without disturbing the area immediately surrounding such selected area. In other cases, it may be desirable to trim away entire sections of a circuit pattern of the board 10 in a rapid and consistent manner. For example, when a particular section of the circuit is no longer needed on the board 10, but the cost to redesign and manufacture the board would be prohibitive, the device 18 can be used to trim the unwanted circuit section.

To accomplish the above-mentioned spot trimming and section trimming, an attachment, designated generally by the numeral 100, as best shown in FIGS. 4, 5 and 6, may be removably secured to the device 18 to restrict the lateral movement of the motor 20 while permitting pivotal movement thereof. The attachment 100 includes a bracket 102 which is pivotally mounted at one end of the side wall 28 (FIG. 5) of the frame 22 by a threaded pin 104. The bracket 102 has a projecting control arm 106 secured thereto and is formed with a vertically depending yoke 108. The yoke 108 straddles opposite sides of the rod 46 of the operating lever 44 (FIGS. 2 and 3) to restrict lateral movement of the rod and the cam follower 50 to a limited distance along the axis of the camming bar 34. When the yoke 108 is properly positioned over the rod 46, the cam follower 50 is positioned to rest between adjacent cam lobes 70 (FIG. 4)

and on a smooth portion of the camming bar 34 (FIG. 6). A laterally extending dowel 110 is attached to the bracket 102 and engages the camming bar 34 when the bracket is pivoted downwardly as illustrated in FIG. 6.

An actuator arm 112 (FIGS. 4 and 5) of the attachment 100 is pivotally mounted on the side wall 26 by threaded pin 114 and is secured by a screw 116 to an adjacent end of the bracket 102. The screw 116 includes a threadless intermediate shank (not shown) which is positioned through an aperture (not shown) in the arm 112. The aperture in the arm 112 is slighter larger in diameter than the diameter of the threadless shank of the screw 116. Thus, when the actuator arm 112 is pivoted downwardly about the pin 114 (FIG. 5), the bracket 102 also can pivot downwardly a slight distance about the pin 104. In this manner, the dowel 110 depresses the spring-biased camming bar 34. This results in a downward movement of the rotating saw blade 24 into engagement with adjacent portions of the board 10. The actuator arm 112 also includes an adjustment screw 118 (FIG. 5) which limits the downward movement of the actuator arm and thus the depth of cut of the saw blade 24 into the board 10.

Referring to FIG. 1, to facilitate locating the device 18 for spot trimming, an additional guide groove 91 is formed on the base 30 perpendicular to the guide grooves 86 for the front locating brackets 80 and 82. The guide groove 91 may be used to permit a location bracket 92 with an alignment pin (not shown) to be secured therein thereby facilitating aligning of the saw blade 24 with a selected portion of the board 10 to be trimmed. To spot trim the selected area of the board 10, the actuator arm 112 is operated, thereby causing the rotating saw blade 24 to engage adjacent portions of the board. The push button 76 and operating rod 78 are then operated as previously described to move the operating lever 44 along the axis of the first support shaft 38 a limited distance as permitted by the yoke 108. In this manner, the rotating saw blade 24 is moved into engagement with selected metal areas to spot trim the areas.

If an entire section of the circuit pattern of the board 10 is to be trimmed away, the locator brackets 80, 82, 84 and 92 are removed from the base 30 to permit the base to slide freely over the surface of the board. With the attachment 100 in place, the adjustment screws 68 for the camming bar 34 are manipulated such that the saw blade 24 is positioned to lightly engage adjacent portions of the board when the device 18 is positioned thereon. By sliding the device 18 along the surface of the board 10 in the selected areas, the rotating saw blade 24 engages metal areas whereby entire unwanted circuit sections are removed from the board in a rapid and consistent manner.

In summary, the precision trimming device 18 is first positioned onto the printed circuit board 10 such that the pins 88 of any two of the locator brackets 80, 82, 84 or 92 extend into selected apertures 14 of the board. Screws 90 of the brackets 80, 82, 84 and 92 are loosened. The base 30 of the device 18 is then slidably moved relative to the board 10 and the location brackets 80, 82, 84 or 92 to align the saw blade 24 with a selected cut line 16 between the contact pads 12a to be trimmed. The screws 90 are then tightened to retain the base 30 in the aligned position on the board 10. Trimming of the metal areas 12a between the adjacent contact pads 12 is then accomplished by moving the operating lever 44 with the aid of the push-button 76 and operating rod 78 along the axis of the first support shaft 38. This causes the cam follower 50 to successively engage the cam lobes 70 along the camming bar 34 resulting in pivotal movement of the rotating saw blade 24 into metal removal engagement with the metal areas 12a. Thus, precision trimming is accomplished between the contact pads 12 on the board 10 to a controlled depth along the cut line 16. In this manner, the metal areas 12a between adjacent contact pads 12 is removed to electrically isolate the pads from each other without damaging the surface of a singled layer board 10 or the underlying circuit layers of a multilayer board.

When the attachment 100 (FIGS. 4, 5 and 6) is mounted onto the trimming device 18, the cam follower 50 is located between an adjacent pair of the cam lobes 70. Further, the yoke 108 of the control arm 106 is positioned to restrict the lateral movement of the operating lever 44 to a limited distance along the axis of the first support shaft 38. To spot trim metal areas on the board 10, the free end of the actuator arm 112 is depressed thus causing the dowel 110 to engage and press downwardly on the camming bar 34. This creates a downward motion of the rotating saw blade 24 to trim away a preselected area of the board 10 without damaging the area immediately surrounding the spot trimmed area. Section trimming is accomplished by removing the location brackets 80, 82, 84 and 92 from the base 30 and adjusting the screws 68 to lower the camming bar 34 so that the saw blade 24 engages the board 10. When the device 18 is slidably moved on the board 10, the rotating saw blade 24 removes the unwanted metal areas.

What is claimed is:

1. A precision trimming device comprising:
   a frame having a base positionable on a surface of an article;
   means mounted on said frame for trimming the surface of the article;
   means mounted on the frame for mounting the trimming means for movement in a first direction adjacent to the surface to be trimmed and simultaneously in a second direction perpendicular to the first direction into trimming engagement with a preselected portion of the surface;
   means mounted on the frame for locating the frame relative to the article so as to locate the trimming means in alignment with a preselected portion of the article to be trimmed;
   first means for moving said trimming means in said first direction; and
   second means, responsive to movement of the trimming means in said first direction, for moving said trimming means in the second direction such that the trimming means trims the preselected portion of the surface of the article.

2. A precision trimming device as set forth in claim 1 wherein said trimming means comprises:
   a saw blade; and
   a drive motor for rotating said saw blade.

3. A precision trimming device as set forth in claim 1, wherein the mounting means comprises:
   a support shaft mounted on said frame; and
   an operating lever mounted for sliding and pivotal movement on said support shaft and movable between non-trimming positions and trimming positions, said trimming means being secured to said operating lever.

4. A precision trimming device as set forth in claim 1, wherein said locating means comprises adjustably mounted locating pins receivable in apertures of the article.

5. A precision trimming device as set forth in claim 3, in which said second moving means comprises:
 a camming bar mounted on said frame;
 a cam follower mounted on said operating lever;
 biasing means for biasing said cam follower into engagement with said camming bar; and
 at least one cam lobe engageable by said cam follower as said operating lever is slidably moved on said support shaft to pivot said operating lever and said trimming means from a non-trimming position into a trimming position to cause trimming of the preselected portion of the surface of the article.

6. A precision trimming device as set forth in claim 3, which further comprises biasing means for normally maintaining the operating lever in a non-trimming, normal rest position on said support shaft.

7. A precision trimming device as set forth in claim 5 which further comprises:
 means for retaining said camming bar on said frame;
 means for biasing said camming bar against said retaining means; and
 means for adjusting the position of said camming bar on said frame against the action of said biasing means to adjust the distance of travel of said trimming means in the second direction relative to the base of the frame.

8. A precision trimming tool as set forth in claim 5 which further comprises:
 means mounted on said frame for selectively restricting movement of said operating lever along said support shaft; and
 means for urging said camming bar toward said cam follower to move said trimming means into engagement with the surface of the article for a spot trimming operation.

9. A precision trimming device as set forth in claim 8 wherein said restricting means includes:
 a bracket mounted for pivotal movement to said frame; and
 a yoke attached to said bracket for restricting movement of said operating lever along said support shaft;
and wherein said urging means includes:
 an actuator arm mounted for pivotal movement to said frame; and
 a dowel attached to said actuator arm and positioned to engage
 and move said camming bar when said actuator arm is pivoted.

10. A precision trimming device comprising:
 a frame positionable on a surface of an article;
 a support shaft mounted on said frame;
 an operating lever mounted for sliding and pivotal movement on said support shaft;
 a saw blade;
 a drive motor for rotating said saw blade, the drive motor being secured to the operating lever for movement therewith;
 a camming bar mounted on said frame;
 a cam follower mounted on said operating lever;
 biasing means for biasing said cam follower into engagement with said camming bar; and
 at least one cam lobe engageable by said cam follower as said operating lever is slidably moved on said support shaft to pivot said operating lever and said saw blade from a non-trimming position into a trimming position to cause trimming of preselected portions of the surface of the article.

11. A precision trimming device as set forth in claim 10 which further comprises:
 a bracket mounted for pivotal movement to said frame;
 a yoke attached to said bracket for restricting movement of said operating lever along said support shaft;
 an actuator arm mounted for pivotal movement to said frame; and
 a dowel attached to said actuator arm and positioned to engage and move said camming bar when said actuator arm is pivoted to move said saw blade into engagement with the surface of the article.

* * * * *